US011450385B2

(12) United States Patent
Gaillardon et al.

(10) Patent No.: US 11,450,385 B2
(45) Date of Patent: Sep. 20, 2022

(54) DIGITAL RRAM-BASED CONVOLUTIONAL BLOCK

(71) Applicant: UNIVERSITY OF UTAH RESEARCH FOUNDATION, Salt Lake City, UT (US)

(72) Inventors: Pierre-Emmanuel Gaillardon, Salt Lake City, UT (US); Edouard Giacomin, Salt Lake City, UT (US); Joao Vieira, Salt Lake City, UT (US)

(73) Assignee: UNIVERSITY OF UTAH RESEARCH FOUNDATION, Salt Lake City, UT (US)

( * ) Notice: Subject to any disclaimer, the term of this patent is extended or adjusted under 35 U.S.C. 154(b) by 483 days.

(21) Appl. No.: 16/577,309

(22) Filed: Sep. 20, 2019

(65) Prior Publication Data

US 2020/0098428 A1 Mar. 26, 2020

Related U.S. Application Data

(60) Provisional application No. 62/734,023, filed on Sep. 20, 2018.

(51) Int. Cl.
*G11C 13/00* (2006.01)
*G06N 3/063* (2006.01)
(Continued)

(52) U.S. Cl.
CPC ........ *G11C 13/0069* (2013.01); *G06F 7/5443* (2013.01); *G06F 17/16* (2013.01);
(Continued)

(58) Field of Classification Search
CPC ..... G11C 19/0069; G11C 13/004; G11C 7/08; G11C 13/003; G11C 2013/009;
(Continued)

(56) References Cited

U.S. PATENT DOCUMENTS 9,741,435 B1 * 8/2017 Choy ................. G11C 11/1673
10,348,306 B2 * 7/2019 Gaillardon .......... H01L 45/1206
(Continued)

OTHER PUBLICATIONS

Agbo et al., "Quantification of Sense Amplifier OffsetVoltage Degradation due to Zero-and Run-Time Variability," IEEE Computer Society Annual Symposium on VLSI, Jul. 2016, pp. 725-730.
(Continued)

*Primary Examiner* — Tan V Mai
(74) *Attorney, Agent, or Firm* — Michael Best & Friedrich LLP

(57) ABSTRACT

One embodiment provides a resistive random-access memory (RRAM) based convolutional block including a complementary pair of RRAMs having a first RRAM and a second RRAM, a programming circuit coupled to the complementary pair of RRAMs, and a XNOR sense amplifier circuit coupled to the complementary pair of RRAMs. The programming circuit is configured to receive a kernel bit from a kernel matrix, program the first RRAM to at least one selected from a group consisting of a low resistive state (LRS) and a high resistive state (HRS) based on the kernel bit, and program the second RRAM to other of the LRS and the HRS. The XNOR sense amplifier circuit is configured to receive an input bit from an input matrix, perform a XNOR operation between the input bit and the kernel bit read from the complementary pair of RRAMs, and output a XNOR output based on the XNOR operation.

20 Claims, 12 Drawing Sheets

(51) Int. Cl.
G06N 20/10 (2019.01)
G06F 7/544 (2006.01)
G11C 7/08 (2006.01)
G06F 17/16 (2006.01)
G06N 3/08 (2006.01)

(52) U.S. Cl.
CPC ............. *G06N 3/0635* (2013.01); *G06N 3/08* (2013.01); *G06N 20/10* (2019.01); *G11C 7/08* (2013.01); *G11C 13/004* (2013.01)

(58) Field of Classification Search
CPC . G11C 2013/79; G11C 13/0007; G11C 11/54; G06N 3/0635; G06N 20/10; G06N 33/08; G06N 3/0454; G06F 7/5443; G06F 17/16; G06F 2207/4814
USPC .......................................................... 708/420
See application file for complete search history.

(56) References Cited

U.S. PATENT DOCUMENTS

2017/0243624 A1\* 8/2017 Foong ................. G11C 11/1693
2018/0174644 A1\* 6/2018 Sakhare ................ G11C 11/417

OTHER PUBLICATIONS

Ambrogio et al., "Impact of low-frequency noise on read distributions of resistive switching memory (RRAM)," IEEE International Electron Devices Meeting, Dec. 2014, pp. 14.4.1-14.4.4.
Binkert et al., "The Gem5 Simulator," SIGARCH Comput. Archit. News, vol. 39, No. 2, pp. 1-7, Aug. 2011.
Chen et al., "A high-throughput and energyefficient rram-based convolutional neural network using data encoding and dynamic quantization," 23rd Asia and South Pacific Design Automation Conference, Jan. 2018, pp. 123-128.
Chen et al., "Eyeriss: An Energy-Efficient Reconfigurable Accelerator for Deep Convolutional Neural Networks," IEEE Journal of Solid-State Circuits, vol. 52, No. 1, pp. 127-138, Jan. 2017.
Chen et al., "Variability of resistive switching memories and its impact on crossbar array performance," in 2011 International Reliability Physics Symposium, Apr. 2011, pp. MY.7.1-MY.7.4.
Chen, "Comparison of Delta-Type Discrete Singular Convolution Kernels for Anti-noise Edge Detection," International Symposium on Computer, Consumer and Control, Jun. 2014, pp. 1229-1232.
Chi et al., "Prime: A novel processing-in-memory architecture for neural networkcomputation in reram-based main memory," ACM/IEEE 43rd Annual International Symposium on Computer Architecture, Jun. 2016, pp. 27-39.
Cong et al., "Minimizing Computation in Convolutional Neural Networks," Artificial Neural Networks and Machine Learning— ICANN 2014.
Courbariaux et al., "Binarynet: Training deepneural networks with weights and activations constrained to +1or -1," CoRR, vol. abs/ 1602.02830, <http://arxiv.org/abs/1602.02830>, 2016.
Du et al., "A Reconfigurable Streaming Deep Convolutional Neural Network Accelerator for Internet of Things," IEEE Transactions on Circuits and Systems I: Regular Papers, vol. 65, No. 1, pp. 198-208, Jan. 2018.
Feinberg et al., "Making Memristive Neural Network Accelerators Reliable," IEEE International Symposium on High Performance Computer Architecture, Feb. 2018, pp. 52-65.
Horowitz, "1.1 Computing's energy problem (and what we can do about it)," IEEE International Solid-State Circuits Conference Digest of Technical Papers, Feb. 2014, pp. 10-14.
HSPICE User Guide: Basic Simulation and Analysis, Synopsys Inc., 2008 (1047 pages).
Hu et al., "Dot-product engine for neuromorphic computing: Programming 1T1M crossbar to accelerate matrix-vector multiplication," in 2016 53nd ACM/EDAC/IEEE Design Automation Conference (DAC), Jun. 2016, pp. 1-6.
Jiang et al., "Verilog—A Compact Model for Oxide-based Resistive Random Access Memory(RRAM)," International Conference on Simulation of Semiconductor Processes and Devices, Sep. 2014, pp. 41-44.
Jo et al., "Energy-Efficient Convolution Architecture Based on Rescheduled Dataflow," IEEE Transactions on Circuits and Systems I: Regular Papers, pp. 1-12, 2018.
Kim et al., "Energy-Efficient Neural Network Acceleration in the Presence of Bit-Level Memory Errors," IEEE Transactions on Circuits and Systems I: Regular Papers, pp. 1-14, 2018.
Krizhevsky et al., "ImageNet Classification with Deep Convolutional Neural Networks," in Advances in Neural Information Processing Systems 25, Pereira, C. J. C. Burges, L. Bottou, and K. Q. Weinberger, Eds. Curran Associates, Inc., 2012, pp. 1097-1105.
Levisse et al., "SneakPath Compensation Circuit for Programming and Read Operationsin RRAM-based CrossPoint Architectures," 15th Non-Volatile Memory Technology Symposium, Oct. 2015, pp. 1-4.
Liang et al., "Cross-Point Memory Array Without Cell Selectors- Device Characteristics and Data Storage Pattern Dependencies," IEEE Transactions on Electron Devices, vol. 57, No. 10, pp. 2531-2538, Oct. 2010.
Liu et al., "RENO: A high-efficient reconfigurable neuromorphic computing accelerator design," 52nd ACM/EDAC/IEEE Design Automation Conference, Jun. 2015, pp. 1-6.
Malladi et al., "Towards Energy-Proportional Datacenter Memory with Mobile DRAM", Annual International Symposium on Computer Architecture, Jun. 2012, pp. 37-48.
Matsunaga et al., "MTJ-Based Nonvolatile Logic-in-Memory Circuit, Future Prospects and Issues," Design, Automation Test in Europe Conference Exhibition, Apr. 2009, pp. 433-435.
Ni et al., "An Energy-Efficient Digital ReRAM-Crossbar-Based CNN With Bitwise Parallelism," IEEE Journalon Exploratory Solid- State Computational Devices and Circuits, vol. 3,pp. 37-46, Dec. 2017.
Pye et al., "A fast algorithm for morphological erosion and dilation," in 1996 8th European Signal Processing Conference (EUSIPCO 1996), Sep. 1996, pp. 1-4.
Rastegar et al., "XNORNet: ImageNet Classification Using Binary Convolutional Neural Networks," CoRR, vol. abs/1603.05279, <http://arxiv.org/abs/1603.05279>, 2016.
Reyserhove et al., "Ultra-low voltage datapath blocks in 28nm utbb fd-soi," IEEE Asian Solid-State Circuits Conference, Nov. 2014, pp. 49-52.
Rosenthal et al., "A Fully Analog Memristor-Based Multilayer Neural Network with Online Backpropagation Training," IEEE International Symposium on Circuits and Systems, May 2016, pp. 1394-1397.
Shafiee et al., "ISAAC: A Convolutional Neural Network Accelerator with In-Situ Analog Arithmetic in Crossbars," ACM/IEEE 43rd Annual International Symposium on Computer Architecture, Jun. 2016, pp. 14-26.
Sim et al., "14.6 a 1.42tops/w deep convolutional neural network recognition processor for intelligent ioe systems", International Solid-State Circuits Conference, Jan. 2016, pp. 264-265.
Soudry et al., "Expectation backpropagation: Parameter-free training of multilayer neural networks with continuous or discrete weights," Proceedings of the 27th International Conference on Neural Information Processing Systems, Vol. 1, 2014, pp. 963-971.
Soudry et al., "Memristor-Based Multilayer Neural Networks With Online Gradient Descent Training," IEEE Transactions on Neural Networks and Learning Systems, vol. 26, No. 10, Oct. 2015, pp. 2408-2421.
Sun et al., "XNOR-RRAM: A Scalable and Parallel Resistive Synaptic Architecture for Binary Neural Networks," Design, Automation Test in Europe Conference Exhibition, Mar. 2018, pp. 1423-1428.
Tang et al., "A Study on the Programming Structures for RRAM-Based FPGA Architectures," IEEE Transactions on Circuits and Systems I: Regular Papers, vol. 63, No. 4, pp. 503-516, Apr. 2016.

(56) References Cited

OTHER PUBLICATIONS

Tang et al., "Binary convolutionalneural network on RRAM," Asia and South Pacific Design Automation Conference, Jan. 2017, pp. 782-787.
Tang et al., "Circuit Designs of High-Performance and Low-Power RRAM-Based Multiplexers Based on 4T(ransistor) 1R(RAM) Programming Structure," IEEE Transactions on Circuits and Systems I: Regular Papers, vol. 64, No. 5, May 2017, pp. 1173-1186.
Torres-Huitzil, "Fast Hardware Architecture for Grey-level Image Morphology with Flat Structuring Elements," IET Image Processing, vol. 8, No. 2, Feb. 2014, pp. 112-121.
Wong et al., "Metal-Oxide RRAM," Proceedings of the IEEE, vol. 100, No. 6, Jun. 2012, pp. 1951-1970.
Xia et al., "Switched by input: Power efficient structure for rram-based convolutional neural network," 53nd ACM/EDAC/IEEE Design Automation Conference, Jun. 2016, pp. 1-6.
Xia et al., "Technological Exploration of RRAM Crossbar Array for Matrix-Vector Multiplication," Journal of Computer Science and Technology, vol. 31, No. 1, Jan. 2016, pp. 3-19.
Yoshioka et al., "Far-field speech recognition using CNN-DNN-HMM with convolution in time," IEEE International Conference on Acoustics, Speech and Signal Processing, Apr. 2015, pp. 4360-4364.
Yu et al., "On the Switching Parameter Variation of Metal Oxide RRAM—Part II: Model Corroboration and Device Design Strategy," IEEE Transactions on Electron Devices, vol. 59, No. 4, Apr. 2012, pp. 1183-1188.
Zhao et al., "Synchronous Non-Volatile Logic Gate Design Based on Resistive Switching Memories," IEEE Transactions on Circuits and Systems I: Regular Papers, vol. 61, No. 2, Feb. 2014, pp. 443-454.

\* cited by examiner

|  | Kernel Size | Energy (mJ) | Delay (s) | Energy[1] Overhead | Delay[1] Overhead |
|---|---|---|---|---|---|
| CMOS MAC | 3x3 | 7.50 | 0.117 | 2.12× | 2.10× |
|  | 5x5 | 21.31 | 0.368 | 2.20× | 2.45× |
|  | 7x7 | 42.01 | 0.746 | 2.22× | 2.57× |
|  | 11x11 | 104.13 | 1.878 | 2.23× | 2.59× |
| CMOS XNOR | 3x3 | 5.69 | 0.063 | 1.60× | 1.12× |
|  | 5x5 | 15.67 | 0.169 | 1.61× | 1.13× |
|  | 7x7 | 30.64 | 0.335 | 1.62× | 1.15× |
|  | 11x11 | 75.56 | 0.821 | 1.62× | 1.14× |
| RRAM XNOR | 3x3 | 3.54 | 0.056 |  |  |
|  | 5x5 | 9.70 | 0.150 |  |  |
|  | 7x7 | 18.95 | 0.290 |  |  |
|  | 11x11 | 46.7 | 0.726 |  |  |

(1) When compared to RRAM XNOR.

| ISAAC-CE [16] | | | | BISAAC | | | |
|---|---|---|---|---|---|---|---|
| Component | Number | Power | Area $mm^2$ | Component | Number | Power | Area $mm^2$ |
| Tile periphery[1] | | 40.9 mW | 0.215 | Tile periphery[1] | | 40.9 mW | 0.215 |
| Hyper Tr[2] | | 10.4 W | 22.88 | Hyper Tr[2] | | 10.4 W | 22.88 |
| IMA properties (12 IMAs per tile) | | | | IMA properties (12 IMAs per tile) | | | |
| 1 IMA = ADC + DAC + S+H + S+A + IR + OR + RRAM array | | | | 1 IMA = BC + IR + OR + RRAM array + XNOR SA + output buffers | | | |
| ADC | 8 | 16 mW | 0.0096 | Bitcount circuit (BC) | 8 | 3.96 µW | 0.0061 |
| DAC | 8×128 | 4 mW | 0.00017 | | | | |
| S+H | 8×128 | 10 µW | 0.00004 | | | | |
| S+A | 4 | 0.2 mW | 0.00024 | | | | |
| IR | 1 | 1.24 mW | 0.0021 | IR | 1 | 1.24 mW | 0.0021 |
| OR | 1 | 0.23 mW | 0.00077 | OR | 1 | 0.23 mW | 0.00077 |
| RRAM array | 8 | 2.4 mW | 0.0002 | RRAM array + XNOR SAs + output buffers | 8 | 2.0 mW[3] | 0.000387[3] |
| IMA total | 12 | 289 mW | 0.157 | IMA total | 12 | 42.5 mW | 0.154 |
| 1 Tile total (12 IMAs + periph.) | | 330 mW | 0.372 | 1 Tile total (12 IMAs + periph.) | | 83.4 mW | 0.369 |
| 168 Tile total | | 55.4 W | 62.3 | 168 Tile total | | 14 W | 61.9 |
| Chip total (tiles + hyper tr) | | 65.8 W | 85.4 | Chip total (tiles + hyper tr) | | 24.4 W | 84.8 |

(1) Periphery: eDRAM buffers, EDRAM-to-IMA buses, routers, sigmoids, S+A, MaxPool and OR [16].
(2) Hyper Transport serial link. More details about this component can be found in [16].
(3) Considering the RRAM arrays as well as the XNOR SAs and the output buffers. For the RRAM array, each column requires twice the number of RRAM cells and access transistors when compared to ISAAC so the area is doubled.

*FIG. 8*

DIGITAL RRAM-BASED CONVOLUTIONAL BLOCK

CROSS-REFERENCE TO RELATED PATENT APPLICATIONS

This application claims priority to U.S. Provisional Application No. 62/734,023, filed Sep. 20, 2018, the entire contents of which are hereby incorporated by reference.

FIELD

Embodiments relate to convolutional logic blocks image processing and machine learning applications.

SUMMARY

Convolution plays an important role in image processing and is a key component in machine learning techniques based on convolutional neural networks (CNNs). Convolution requires high processing cost as convolution involves a significant amount of data movement between a computation unit and memory. As a result, convolutional blocks may also consume a large amount of power. This high processing cost and large power consumption renders convolutional blocks unsuitable for smaller devices such as embedded systems, smartphones, and the like.

One solution to the high processing cost of convolutional blocks may include using energy-efficient hardware accelerators. The hardware accelerators are suitable for internet-of things (IoT) devices. Although the hardware accelerators increase the speed at which convolutions are processed, the hardware accelerators do not reduce the processing cost or complexity of the operations. Additionally, the hardware accelerators add to the power consumption requirement of the devices.

Another solution is to use resistive random access memories (RRAMs) to perform an analog dot product of the input and kernel matrices and outputting a current that is a sum of the products. The RRAMs are arranged into crossbar passive arrays to perform the analog dot products. The output currents are the sums of the currents flowing through each RRAM cell and each current is a product of the input voltage times the conductance of the RRAM. This solution provides for reduced area of the processing circuit. However, this solution requires analog-to-digital converters (ADCs) and digital-to-analog converters (DACs), which may increase the area and may increase the power consumption. Additionally, the device to device variability of RRAMs may also introduce errors that reduce the accuracy of the convolutional blocks.

Yet another solution includes the use of RRAMs to perform a binary dot product using binary input and kernel matrices with comparator sensor amplifiers (CSAs) or reduced precisions ADCs. This solution improves both energy efficiency and robustness of the implementation against RRAM process variations. However, the offset voltage of the CSAs may lead to operational failure of the solution.

Accordingly, there is a need for an RRAM-based convolutional block that reduces processing cost and energy consumption while accounting for RRAM process variations and improving accuracy of the convolutional block.

One embodiment provides a resistive random-access memory based convolutional block including a complementary pair of resistive random access memories (RRAMs) having a first resistive random-access memory (RRAM) and a second RRAM, and a programming circuit coupled to the complementary pair of RRAMs. The programming circuit is configured to receive a kernel bit from a kernel matrix, program the first RRAM to at least one selected from a group consisting of a low resistive state and a high resistive state, based on the kernel bit, and program the second RRAM to the other of the low resistive state and the high resistive state. The RRAM-based convolutional block also includes a XNOR sense amplifier circuit coupled to the complementary pair of RRAMs. The XNOR sense amplifier circuit is configured to receive an input bit from an input matrix, perform a XNOR operation between the input bit and the kernel bit read from the complementary pair of RRAMs, and output a XNOR output based on the XNOR operation.

Another embodiment provides a resistive random-access memory based convolutional block including a complementary resistive random access memory (RRAM) array and a programming circuit coupled to the complementary RRAM array. The programming circuit is configured to receive a plurality of kernel bits from a kernel matrix, and program a plurality of columns of the complementary RRAM array based on a corresponding one of the plurality of kernel bits. The RRAM-based convolutional block also includes a XNOR sense amplifier circuit array coupled to the complementary RRAM array. The XNOR sense amplifier circuit array is configured to receive a plurality of input bits from an input matrix, perform a bit-wise XNOR operation between the plurality of input bits and the plurality of kernel bits stored in the complementary RRAM array, and output a plurality of XNOR outputs based on the bit-wise XNOR operation.

Other aspects of the invention will become apparent by consideration of the detailed description and accompanying drawings.

BRIEF DESCRIPTION OF THE DRAWINGS

FIG. 8 illustrates a table showing the power and area savings offered by a hardware accelerator implementing the RRAM-based convolutional block of FIG. 1 compared to a hardware accelerator without the RRAM-based convolutional block of FIG. 1.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

A convolution between two real value matrices (for example, a kernel and an input matrix) includes a repeated shift operation which moves the kernel over the input and dot product, which performs element-wise multiplications between the kernel and the input. The dot product is the sum of products between the elements of the two matrices. By constraining the input and kernel matrix values to binary bits (−1 or +1), the multiplication and sum of products operations may be replaced by a XNOR and bitcount operations. An RRAM-based storage system may be used to store the kernel bits and a XNOR sense amplifier circuit may be used to perform a XNOR operation between the kernel bits and input bits received at the XNOR sense amplifier circuit. The final dot product may be determined by using the bitcount operation between the various XNOR sense amplifier circuits.

Figure 1:
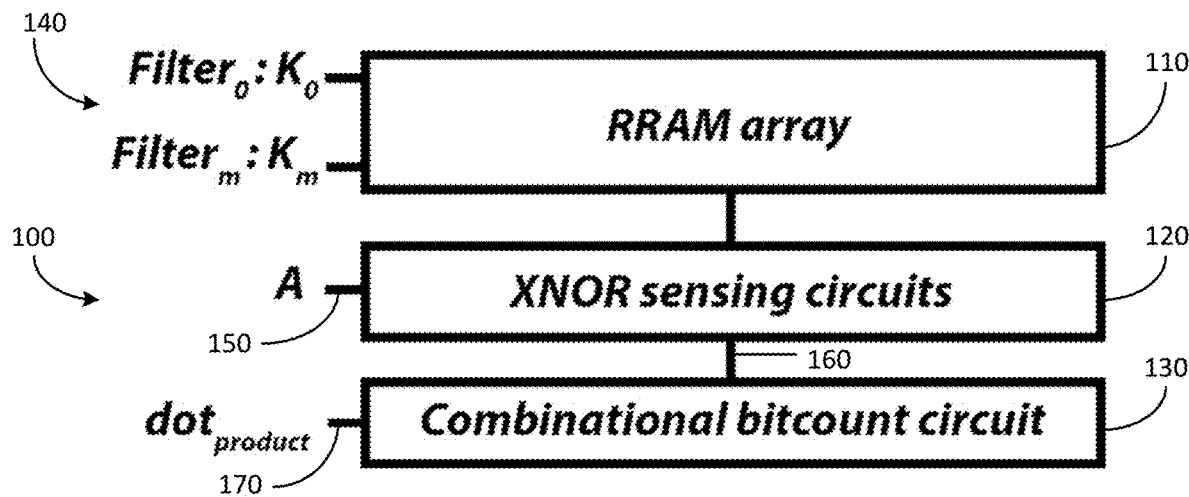
FIG. 1 illustrates an RRAM-based convolutional block in accordance with some embodiments.

FIG. 1 is a simplified block diagram of an example RRAM-based convolutional block 100. In the example illustrated, the RRAM-based convolutional block includes an RRAM array 110, XNOR sensing circuits 120 (for example, XNOR sense amplifier circuit array), and a combinational bitcount circuit 130. The RRAM-based convolutional block 100 may include more or fewer components than those illustrated in FIG. 1 and may perform additional functions other than those described herein.

The RRAM array 110 includes a kernel input 140 to receive a plurality of kernel bits from a kernel matrix. The RRAM array 110 stores the kernel bits in complementary pairs of RRAMs (shown in FIG. 2). The RRAM array 110 provides the kernel bits to the XNOR sensing circuits 120 for performing a XNOR operation on the kernel bits. The XNOR sensing circuits 120 include a matrix input 150 to receive input bits "a" from an input matrix. The XNOR sensing circuits 120 perform a XNOR operation between the input bits "a" received at the matrix input 150 and the kernel bits stored in the RRAM array 110 to output a XNOR output 160 to the combinational bitcount circuit 130. The combinational bitcount circuit 130 counts the number of zeros or ones in the XNOR output 160 to provide a dot product output 170.

Figure 2B:
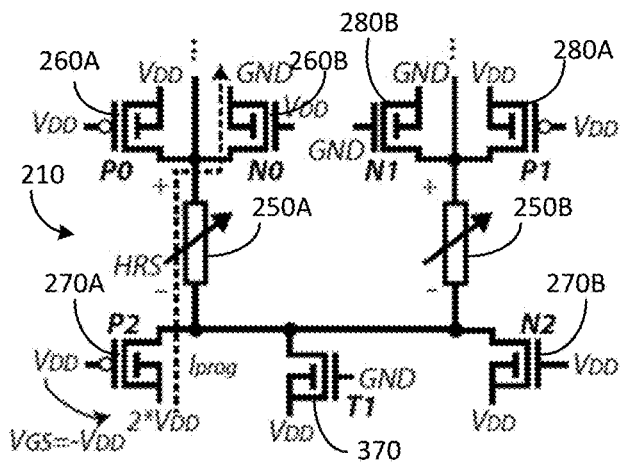
FIGS. 2A-2D illustrate an RRAM-based XNOR cell used in the RRAM-based convolutional block of FIG. 1 in accordance with some embodiments.
Figure 2C:
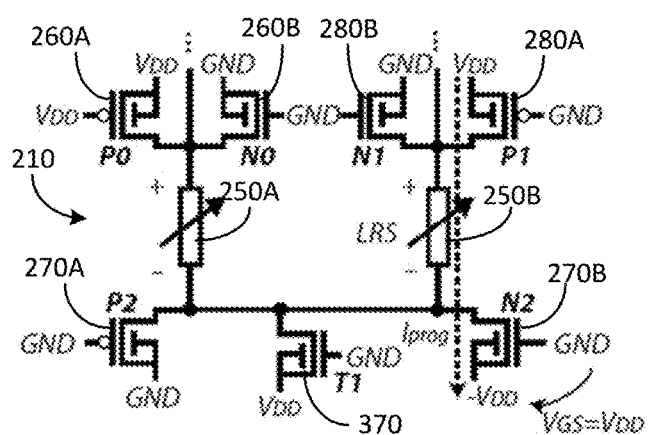
Figure 2A:
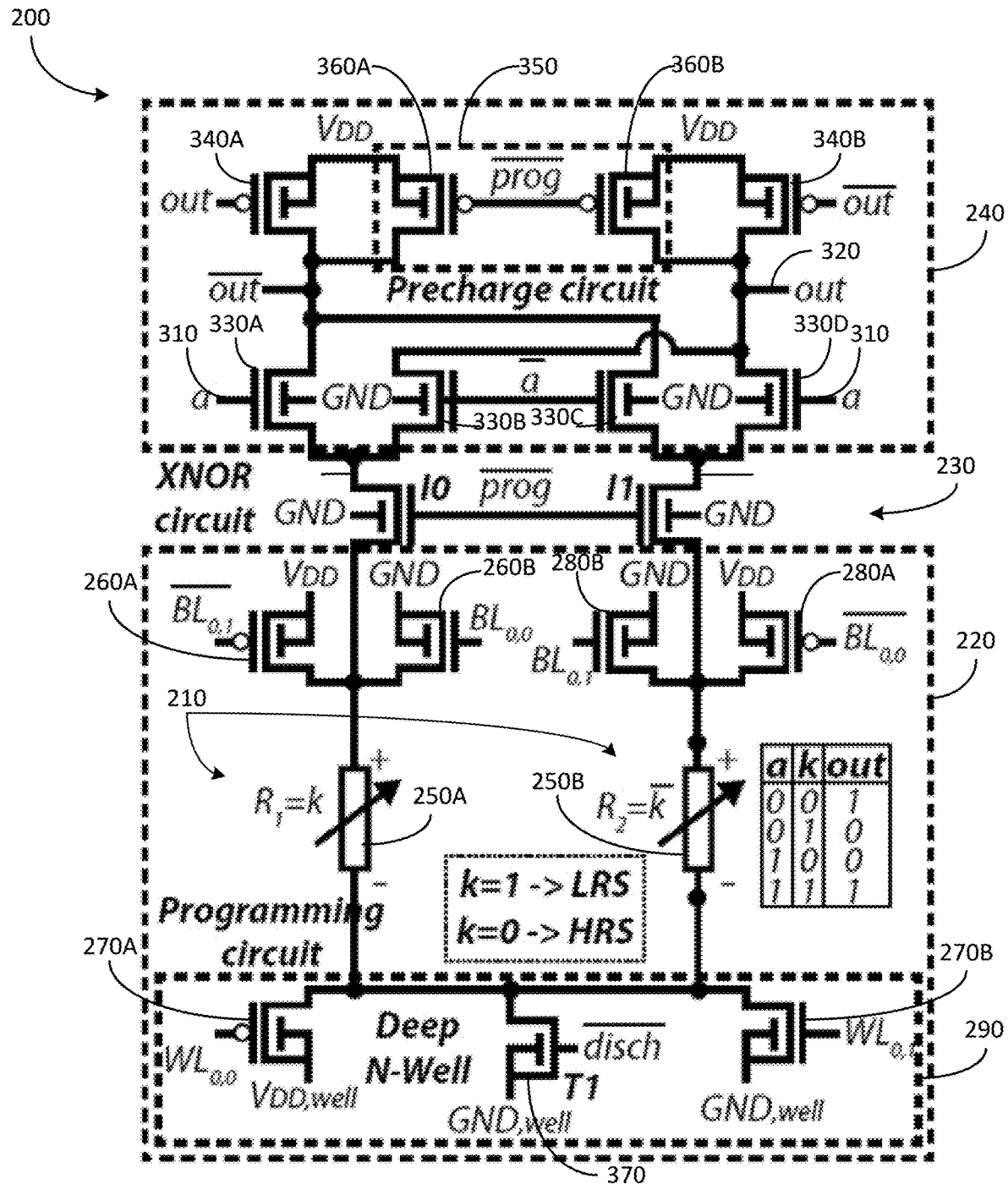

FIG. 2A illustrates an example RRAM-based XNOR cell 200 that forms a building block of the RRAM array 110 and the XNOR sensing circuit 120. In the example illustrated, the RRAM-based XNOR cell 200 includes a complementary pair of resistive random access memories (RRAMs) 210, a programming circuit 220, an isolation circuit 230, and a XNOR sense amplifier circuit 240. The RRAM-based XNOR cell 200 may include more or fewer components than those illustrated in FIG. 2 and may perform additional functions other than those described herein.

The complementary pair of RRAMs 210 includes a first resistive random access memory (RRAM) 250A, and a second resistive random access memory (RRAM) 250B. A RRAM 250 (including the first RRAM 250A and second RRAM 250B) is a two-terminal device including a metal electrodes and a switching oxide stack. By applying a programming voltage between the two electrodes, the conductivity of the metal oxide can be changed leading to a switching event of the RRAM 250 between two stable resistance states: (1) a low resistance state (LRS); and (2) a high resistance state (HRS). Accordingly, the RRAM 250 stores a logic binary data 1 and 0 in the LRS and HRS respectively. Applying a positive programming voltage will induce a switching from HRS to LRS (i.e., 0 to 1) called a set process. On the other hand, applying a negative programming voltage will induce a switching from LRS to HRS called a reset process.

The programming circuit 220 programs (that is, sets or resets) the complementary pair of RRAMs 210. In the example illustrated, the programming circuit 220 includes a 4Transistors 1RRAM (4T1R) structure with a memory bank organization including word lines and bit lines to provide programming input to the 4T1R structure. In other embodiments, a 2T1R, a 2Transmission Gates 1 RRAM, or the like structures can be used to program the complementary pair of RRAMs. Additionally, a scan chain organization including flip flops rather than the memory bank organization may be used to provide the programming input to the programming structures.

The programming circuit 220 employs a first PMOS transistor 260A, and a first NMOS transistor 260B, along with a shared PMOS transistor 270A and a shared NMOS transistor 270B, to trigger set and rest process for the first RRAM 250A. The first PMOS transistor 260A, the first NMOS transistor 260B, the shared PMOS transistor 270A, and the shared NMOS transistor 270B form the 4T1R programming structure for the first RRAM 250A. Similarly, the programming circuit 220 employs a second PMOS transistor 280A, and a second NMOS transistor 280B along with the shared PMOS transistor 270A and the shared NMOS transistor 270B to trigger set and rest process for the second RRAM 250B. The second PMOS transistor 280A, the second NMOS transistor 280B, the shared PMOS transistor 270A, and the shared NMOS transistor 270B form the 4T1R programming structure for the second RRAM 250B. The first PMOS transistor 260A and the second PMOS transistor 280A are coupled to supply voltage VDD, while the first NMOS transistor 260B and the second NMOS transistor 280B are coupled to ground. The shared transistors 270A, 270B are provided in a deep N-well 290 that may be switched between twice the supply voltage 2VDD and negative supply voltage −VDD to program the complementary pair of RRAMs 210. The deep N-well 290 allows for use of large programming voltage ranges without using input/output transistors. Accordingly, constant supply voltage VDD and ground are provided at transistors 260A, 260B, 280A, and 280B, while switchable voltage supply for providing 2VDD and −VDD is provided at transistors 270A and 270B. Additional description of the programming structures to program the complementary pair of RRAMs is provided in U.S. Pat. No. 10,348,306 titled, "RESISTIVE RANDOM ACCESS MEMORY BASED MULTIPLEXERS AND FIELD PROGRAMMABLE GATE ARRAYS," the entire contents of which are hereby incorporated by reference.

In one example as shown in FIG. 2B, the first NMOS transistor 260B and the shared PMOS transistor 270A are turned on while keeping the other transistors 260A, 270B, 280A, and 280B off to reset the first RRAM 250A. The first NMOS transistor 260B ties the top electrode of the first RRAM 250A to ground. In this example, the voltage of the deep N-well 290 is set to twice the supply voltage 2VDD such that a resetting voltage of −2VDD is applied across the terminals of the first RRAM 250A. Similarly, the second NMOS transistor 280B and the shared PMOS transistor 270A are turned on while keeping the other transistors 260A, 260B, 270B, and 280A off to reset the second RRAM 250B.

In one example shown in FIG. 2C, the second PMOS transistor 280A and the shared NMOS transistor 270B are turned on while keeping the other transistors 260A, 260B, 270A, and 280B turned off to set the second RRAM 250B. The second PMOS transistor 280A ties the top electrode of the second RRAM 250B to supply voltage VDD. In this example, the voltage of the deep N-well 290 is set to negative supply voltage −VDD such that a setting voltage of 2VDD is applied across the terminals of the second RRAM 250B. Similarly, the first PMOS transistor 260A and the shared NMOS transistor 270B are turned on while keeping the other transistors, 260B, 270A, 280A, and 280B off to set the first RRAM 250A.

During a kernel store phase (for example, a programming phase), the first RRAM 250A and the second RRAM 250B are programmed in a complementary fashion based on the kernel bit. For example, when the kernel bit is logic binary 1, the first RRAM 250A is programmed to a LRS and the second RRAM 250B is programmed to a HRS. Similarly, when the kernel bit is logic binary 0, the first RRAM 250A is programmed to a HRS and the second RRAM 250B is programmed to a LRS.

The isolation circuit 230 isolates the XNOR sense amplifier circuit 240 from the programming circuit 220 during the kernel store phase such that the outputs are not driven during the programming of the first RRAM 250A and the second RRAM 250B. The isolation circuit 230 includes a first isolation transistor 300A and a second isolation transistor 300B that couple the programming circuit 220 to the XNOR sense amplifier circuit 240. Particularly, the first isolation transistor 300A couples the first RRAM 250A to the XNOR sense amplifier circuit 240 and the second isolation transistor 300B couples the second RRAM 250B to the XNOR sense amplifier circuit 240. In the example illustrated, the first isolation transistor 300A and the second isolation transistor 300B are NMOS transistors that are disabled during the kernel store phase. In other embodiments other types of transistors may be used. The first isolation transistor 300A and the second isolation transistor 300B are driven by a complementary programming input $\overline{\text{prog}}$. The programming input is asserted during the kernel store phase. Accordingly, the first isolation transistor 300A and the second isolation transistor 300B are turned off during the kernel store phase.

The XNOR sense amplifier circuit 240 includes a matrix input 310 and a readout 320. The matrix input 310 receives an input bit "a" from the input matrix and the readout 320 outputs the dot product between the input bit "a" and the kernel bit. The XNOR sense amplifier circuit 240 includes a first input transistor 330A and a second input transistor 330B with the sources of the first input transistor 330A and the second input transistor 330B coupled to the first RRAM 250A through the first isolation transistor 300A. The XNOR sense amplifier circuit 240 also includes a third input transistor 330C and a fourth input transistor 330D with the sources of the third input transistor 330C and the second input transistor 330B coupled to the second RRAM 250B through the second isolation transistor 300B. In the example illustrated, the input transistors 330A-D are NMOS transistors, however, other types of transistors may also be used. The gates of the first input transistor 330A and the fourth input transistor 330D receive the input bit "a" and are driven by the input bit "a". As discussed above, the input bit can take one of two states: (i) a logic binary 0; or (ii) a logic binary 1 respectively, for example, denoted by ground or supply voltage VDD. The gates of the second input transistor 330B and the third input transistor 330C receive the complementary input bit "$\overline{a}$" and are driven by the complementary input bit "$\overline{a}$".

The drains of the first input transistor 330A and the third input transistor 330C are coupled to source of a first load transistor 340A and the drains of the second input transistor 330B and the fourth input transistor 330D are coupled to source of a second load transistor 340B. The source of the second load transistor 340B provides the readout 320 "out" and the source of the first load transistor 340A provides a complementary readout "$\overline{\text{out}}$". In the example illustrated, the first load transistor 340A and the second load transistor 340B are PMOS transistors, however, other types of transistors may also be used. The gate of the first load transistor 340A is driven by the readout 320 "out" and the gate of the second load transistor 340B is driven by the complementary readout "$\overline{\text{out}}$". The drains of the first load transistor 340A and the second load transistor 340B are provided with the supply voltage VDD.

The XNOR sense amplifier circuit 240 also includes a pre-charge circuit 350 having a first pre-charge transistor 360A and a second pre-charge transistor 360B. The first pre-charge transistor 360A is connected between the supply voltage and the complementary readout "$\overline{\text{out}}$" and the second pre-charge transistor 360B is connected between the supply voltage and the readout 320 "out". In the example illustrated, the first pre-charge transistor 360A and the second pre-charge transistor 360B are PMOS transistors, however, other types of transistors may also be used. The first pre-charge transistor 360A and the second pre-charge transistor 360B are driven by the complementary programming input "$\overline{\text{prog}}$". Accordingly, the pre-charge circuit 350 loads both outputs "out" and "$\overline{\text{out}}$" to the supply voltage before the XNOR cell 200 is switched from the kernel store phase to a computing phase. A discharge transistor 370 is provided in the deep N-well for operation during the computing phase. The discharge transistor 370 couples the first RRAM 250A and the second RRAM 250B to ground during the computing phase. The discharge transistor 370 is driven by a complementary discharge input "disch'".

Figure 2D:
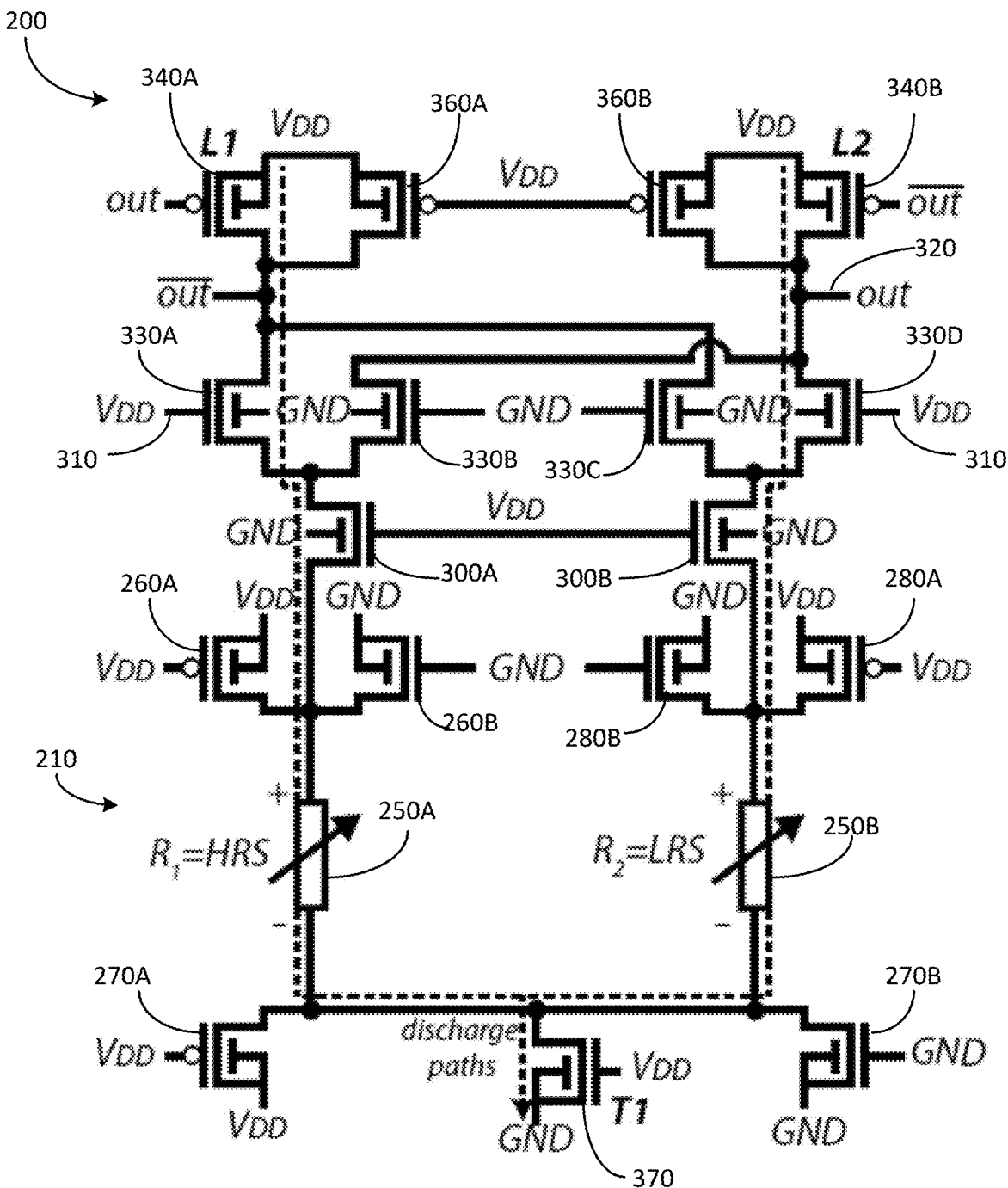

An example computing phase is illustrated in FIG. 2D, where the XNOR cell 200 performs a XNOR operation between an input bit a=1 and a kernel bit k=0. Since the kernel bit is 0, the first RRAM 250A is programmed to HRS and the second RRAM 250B is programmed to LRS during the kernel store phase as illustrated in FIGS. 2B and 2C. Once the first RRAM 250A and the second RRAM 250B are programmed to the kernel bit, the programming input "prog" and is set to 0 (i.e., ground) and the complementary discharge input "disch'" is set to 1 (i.e., VDD). The programming input "prog" therefore disables the pre-charge circuit 350 and controls the isolation circuit 230 to connect the first RRAM 250A and the second RRAM 250B to the XNOR sense amplifier circuit 240. The complementary discharge input "disch'" controls the discharge transistor 370 to connect the outputs "out" and "$\overline{out}$" through the first RRAM 250A and the second RRAM 250B.

Since the input bit "a" is 1, first input transistor 330A and the fourth input transistor 330D are turned on while the second input transistor 330B and the third input transistor 330C are turned off. Accordingly, the complementary readout "$\overline{out}$" is discharged through the first RRAM 250A and the readout 320 "out" is discharged through the second RRAM 250B. Since the second RRAM 250B is in a low resistive state (LRS) and the first RRAM 250A is in a high resistive state (HRS), the residual voltage of readout 320 "out" is discharged faster than the residual voltage of complementary readout "$\overline{out}$". The readout 320 "out" is therefore grounded before the complementary readout "$\overline{out}$" can be grounded. The first load transistor 340A is turned on when the readout 320 "out" is grounded and the first load transistor 340A pulls the complementary readout "$\overline{out}$". The second load transistor 340B remains off during this time. The readout "out" provides the correct output, that is, 0 in this case when the input bit is 1 and the kernel bit is 0.

Figure 3A:
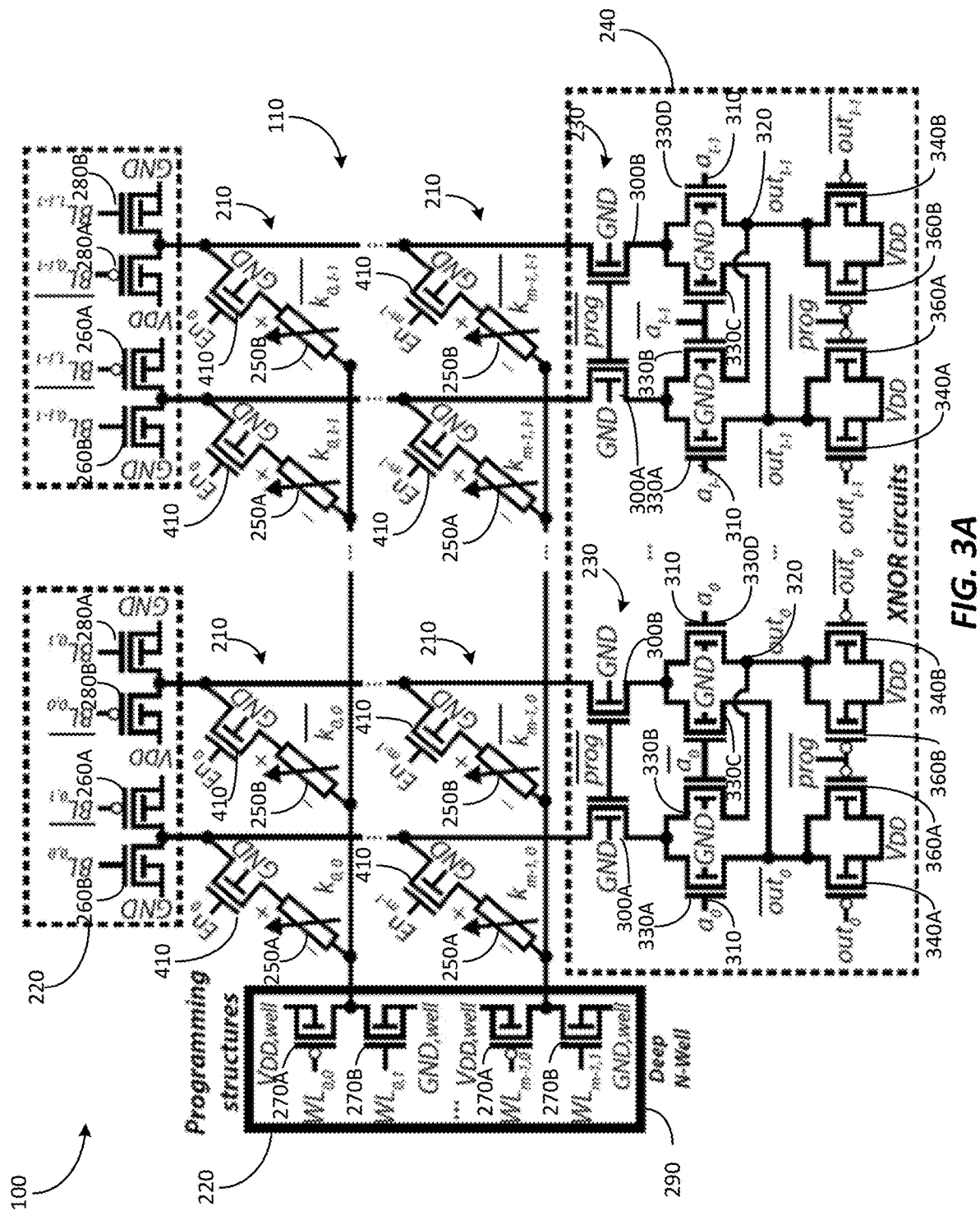
FIGS. 3A-3B illustrates an RRAM-based XNOR cell array used in the RRAM-based convolutional block of FIG. 1 in accordance with some embodiments.
Figure 3B:
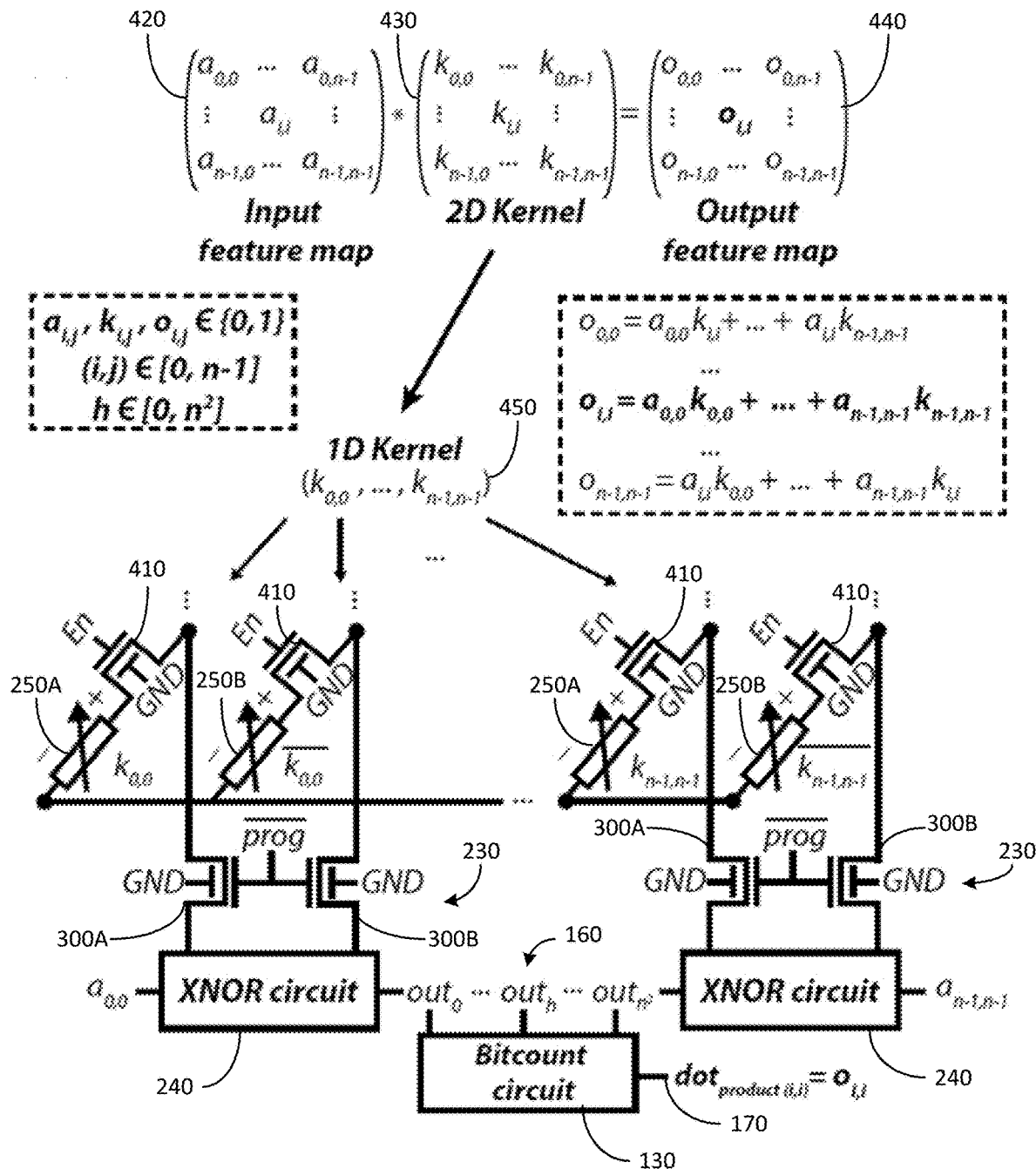

Several of the XNOR cells 200 illustrated in FIGS. 2A-D can be organized into an array to implement the RRAM array 110 and XNOR sensing circuits 120. FIGS. 3A-B illustrate one example showing an m×l RRAM matrix array that may be utilized as the RRAM array 110 and the XNOR sensing circuits 120. Here, m is the number of different kernels to be stored and l is the number of elements of the output matrix. For example, storing ten 3×3 kernels may need a 10×9 array. The RRAM matrix array 110 may include more or fewer components than those illustrated in FIGS. 3A-B and may perform functions other than those described herein.

In the example illustrated, the RRAM matrix array 110 includes an m×l arrangement of complementary pairs of RRAMs 210 and l number of XNOR sense amplifier circuits 240 each coupled to a column of complementary pairs of RRAMs 210. The programming circuit 220 is also shared between all of the m×l complementary pairs of RRAMs 210. The programming circuit 220 can individually address all of the RRAMs 250. Sharing the programming circuits 220 allows for parallel programming of the RRAMs 250. Each RRAM 250 of the complementary pair of RRAMs 210 is coupled to the XNOR sensing circuits 120 through an enabling transistor 410. The enabling transistor 410 is driven by an enable signal "$En_i$" such that the corresponding RRAM 250 can be selectively coupled to the XNOR sensing circuits 120. In the example illustrated, all the enabling transistors 410 (for example, a plurality of enabling transistors) in a single row of the m×l array are driven by the same enable signal "$En_i$". Accordingly, m number of enable signals are provided to the m×l complementary pairs of RRAMs 210. The enable signals "$En_i$" are provided such that only a single row of complementary pairs of RRAMs 210 are coupled to the XNOR sensing circuits 120 at any instance.

FIG. 3B illustrates a XNOR operation between an input matrix 420 and a kernel matrix 430 to output an output matrix 440. In the example illustrated, the 2-dimensional kernel matrix 430 is unrolled into a 1-dimensional kernel vector 450 such that the kernel vector 450 can be programmed into the complementary pairs of RRAMs 210. The kernel vector 450 is programmed into each row of complementary pairs of RRAMs 210. As discussed above, during the kernel store phase, the XNOR sense amplifier circuits 240 are isolated from the complementary pairs of RRAMs 210 using isolation circuits 230 (for example, isolation circuit array). During the computing phase, the XNOR sense amplifier circuits perform a XNOR operation between the input bits from the input matrix 420 and the kernel bits from the kernel vector 450 and provide XNOR outputs "$out_h$" to the combinational bitcount circuit 130. The combinational bitcount circuit 130 counts the number of zeros in the XNOR outputs "$out_h$" and provides the dot product output "$o_{i,j}$". During the computing phase, the kernel bits are stored on the complementary pairs of RRAMs 210 while the input bits are fetched from memory. Each row of the complementary pairs of RRAMs 210 is selectively enabled using the enable signals "$En_i$" to perform the XNOR operations.

Figure 4:
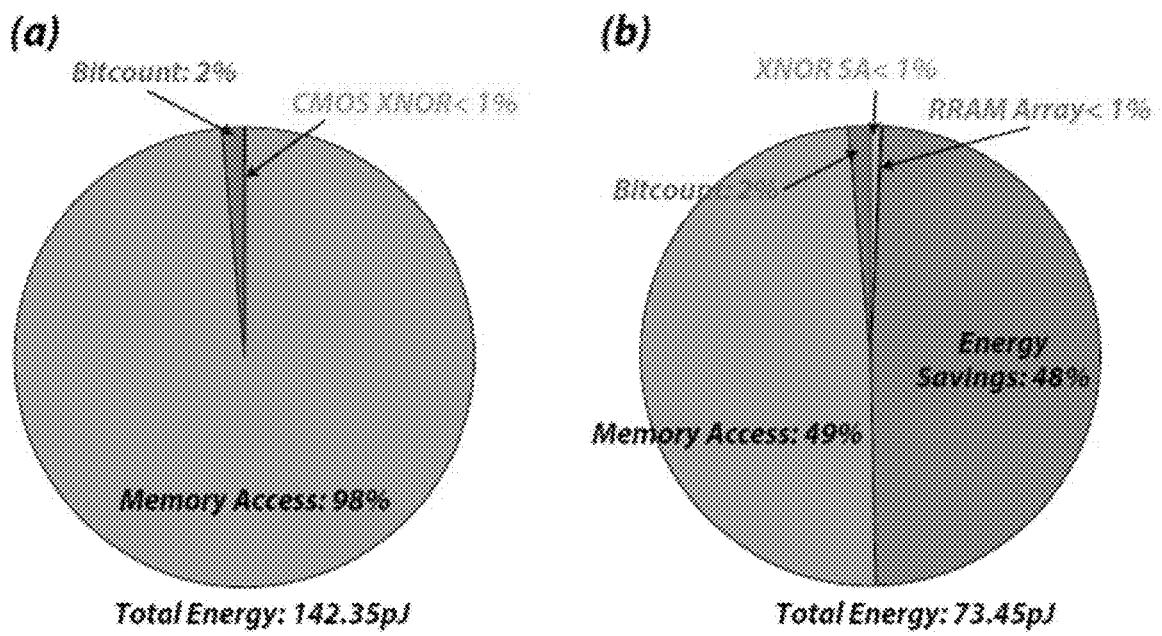
FIG. 4 illustrates a pie chart showing energy savings provided by the RRAM-based convolutional block of FIG. 1 over a CMOS XNOR block.
Figure 5:
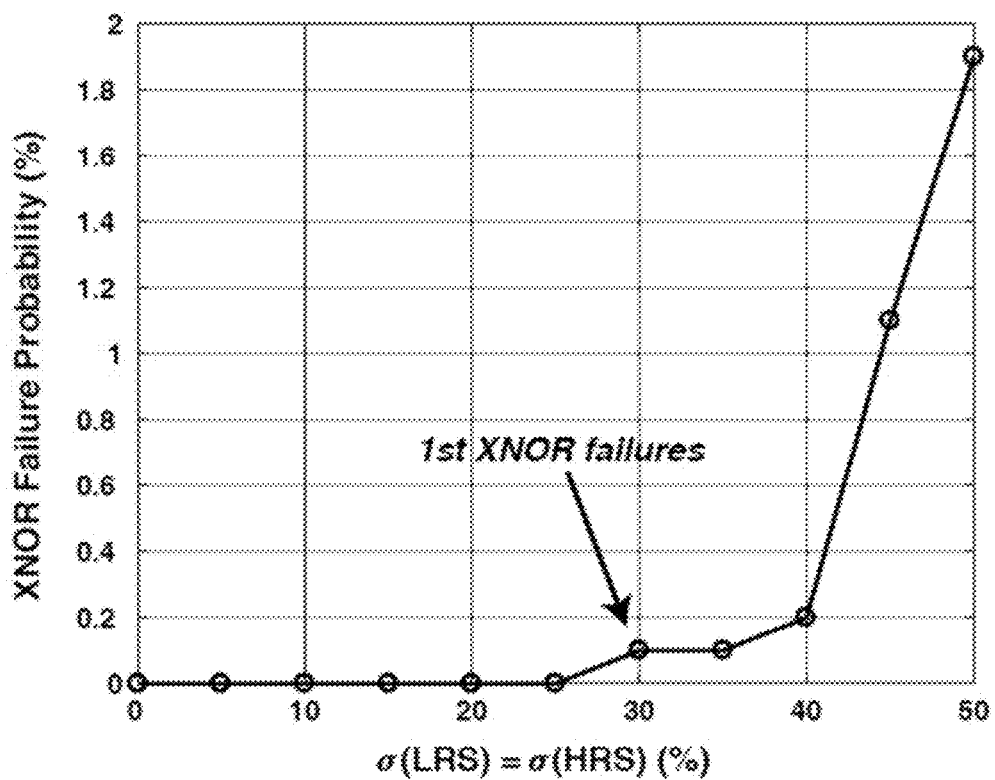
FIG. 5 illustrates a graph showing the robustness of the RRAM-based convolutional block of FIG. 1.

The RRAM-based convolutional blocks 100 offer several advantages over other types of convolutional blocks and neural networks. FIG. 4 illustrates the energy benefits offered by a 128×128 RRAM-based convolutional block 100 against a 128×128 CMOS XNOR implementation. As illustrated in FIG. 4, although the energy consumption of the convolutional block components of the RRAM-based convolutional block 100 are similar to the convolutional block components of the CMOS based implementation, the RRAM-based convolutional block 100 offers significant savings in terms of energy consumption due to memory access. Particularly, by providing storage of kernel bits in complementary pairs of RRAMs 210, the RRAM-based convolutional block reduces the need for excess memory access thereby providing up to 48% energy savings over a CMOS based XNOR implementation. Additionally, the RRAM-based convolutional block 100 is robust and highly accurate compared to other implementation. Particularly, the RRAM-based convolutional block 100 overcomes any error that may be introduced by the device-to-device variability of the RRAMs. When considered for a 25×25 RRAM-based convolutional block 100, FIG. 5 illustrates the robustness of the design based on variability in the RRAMS. Particularly, for standard deviations of LRS and HRS that are less than 25%, Monte Carlo simulations resulted in zero XNOR failures. The RRAM-based convolutional block 100 works with state-of-the-art RRAMs that offer below 25% variability and therefore provide 100% reliability.

Figures 6, 9:
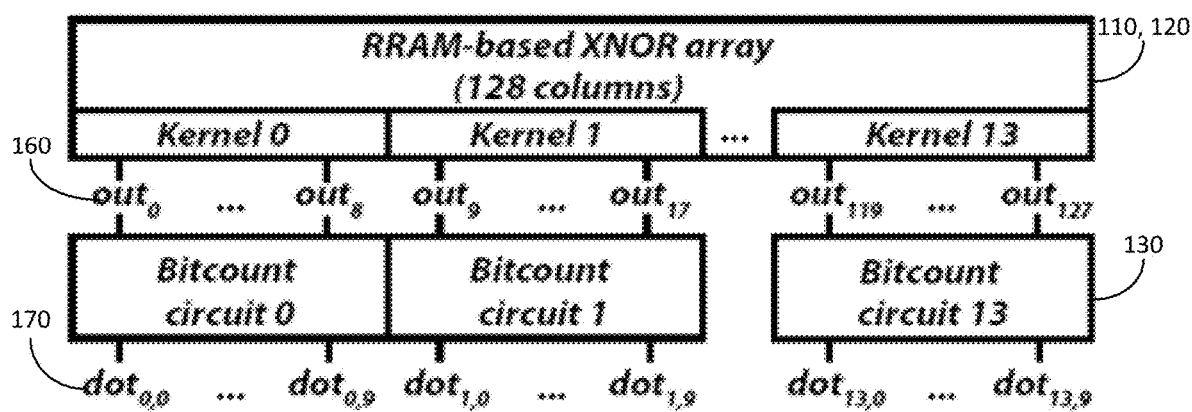
FIG. 6 illustrates a table showing the energy overhead and delay overhead of CMOS multiply-accumulate blocks and CMOS XNOR block compared to the RRAM-based convolutional block of FIG. 1.
FIG. 9 illustrates an alternative RRAM-based convolutional block in accordance with some embodiments.

The RRAM-based convolutional blocks 100 also offer several advantages over other types of convolutional blocks and neural networks when used in real-world implementations. For example, when implemented in an image processing dilation application, the RRAM-based convolutional block provided significant energy and time savings over other convolutional blocks and neural networks. FIG. 6 illustrates exemplary energy and time savings offered by the RRAM-based convolutional block against a CMOS multiply-accumulate (MAC) unit and a standard CMOS XNOR sense amplifier circuit.

Figure 7:
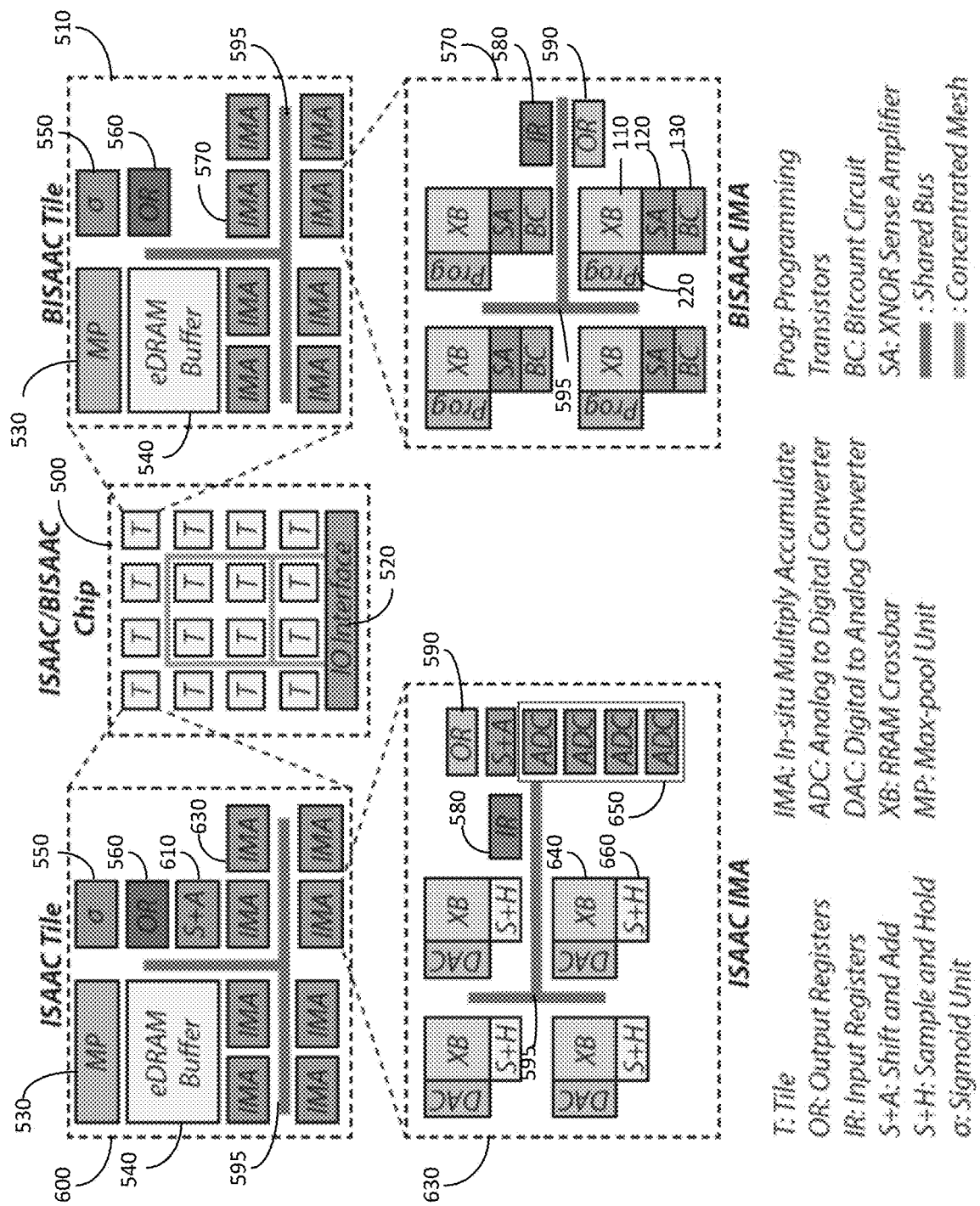
FIG. 7 illustrates a simplified block diagram of a hardware accelerator including the RRAM based convolutional block of FIG. 1 in accordance with some embodiments.

FIG. 7 illustrates the implementation of the RRAM-based convolutional block 100 in a hardware accelerator 500. In the example illustrated, the hardware accelerator 500 is an ISAAC hardware accelerator developed by the Computer Science Department of University of Utah. The hardware accelerator 500 includes a plurality of tiles 510 and an input output interface 520. Each tile 510 (Referred to as BISAAC) includes a max-pool unit 530, an eDRAM buffer 540, a sigmoid unit 550, output registers 560 and in-situ multiply accumulate units 570. The in-situ multiply accumulate units include input registers 580, output registers 590 and a plurality of RRAM-based convolutional blocks 100. Shared buses 595 are used in the tiles 510 and the in-situ multiply accumulate units to distribute information between the multiple components.

In comparison, an analog implementation of the tile 600 (referred to as ISAAC-CE) additionally includes a shift and add unit 610 and an analog implementation of the in-situ multiply-accumulate unit 630 includes a plurality of analog convolutional blocks 640 instead of the RRAM-based convolutional blocks 100. To accommodate the plurality of analog convolutional blocks 640, a plurality of analog-to-digital converters 650 and an in-situ sample and add unit 660 are also provided in the analog in-situ multiply-accumulate unit 630. Compared to the analog implementation of the tile 600, the binary implementation of the tile 510 provides several energy and size benefits as illustrated in FIG. 8.

FIG. 9 illustrates the RRAM-based convolutional block 100 in accordance with another embodiment. In the example illustrated, the RRAM-based convolutional block 100 includes 128 columns of complementary pairs of RRAMs 210. The RRAM-based convolutional block illustrate how the dot product may be computed using a parallel arrangement of the kernels to further improve the performance of the RRAM-based convolutional block 100.

Additional description of the RRAM-based convolutional block 100 and comparisons showing relative benefits of the RRAM-based convolutional block 100 are described in detail in the publication titled "A ROBUST DIGITAL RRAM-BASED CONVOLUTIONAL BLOCK FOR LOW-POWER IMAGE PROCESSING AND LEARNING APPLICATIONS" published in IEEE Transactions on Circuits and Systems, Regular Papers, Vol. 66, No. 3, 2019, pp. 653-654, the entire contents of which are hereby incorporated by reference.

Figure 10:
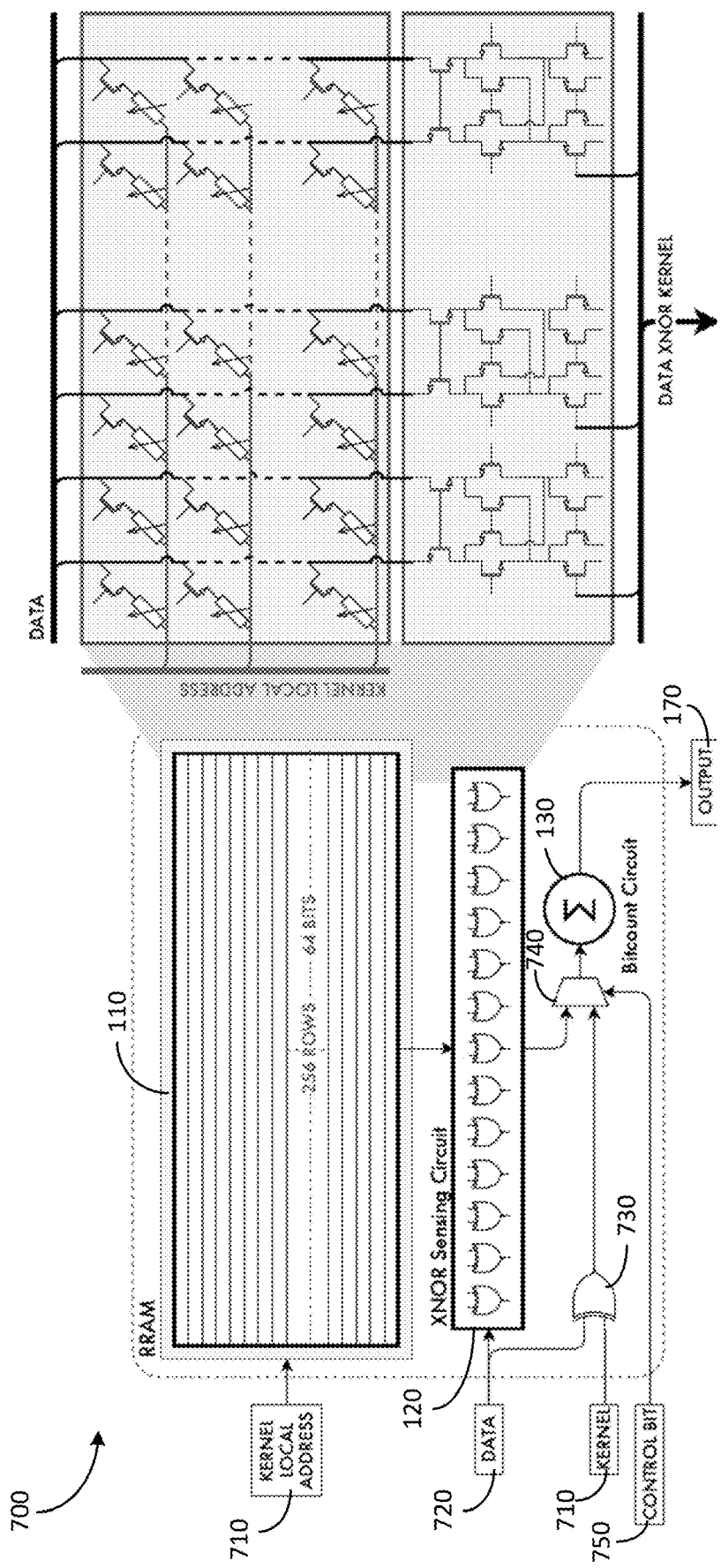
FIG. 10 illustrates a binary dot product engine including the RRAM-based convolutional block of FIG. 1 in accordance with some embodiments.

FIG. 10 is a simplified block diagram of a binary dot product engine (BDPE) 700 (for example, binary dot product circuit) including the RRAM-based convolutional block 100. The BDPE 700 includes a kernel local address unit 710, input data unit 720, alternative XNOR circuit 730, and a selection circuit 740. The kernel local address unit 710 provides the kernel bits to the RRAM array 110 (for example, RRAM XNOR array) and the alternative XNOR circuit 730. The input data unit 720 provides the input data to the XNOR sensing circuit 120 and the alternative XNOR circuit 730. The alternative XNOR circuit 730 provides an alternative method to perform the dot product when the dot product is not based on frequently used kernels. The selection circuit 740 selects between the RRAM-based convolutional block 100 and the alternative XNOR circuit 730 to provide the output of either to the combinational bitcount circuit 130. The selection circuit 740 is controlled by a control bit 750 to select between an output of the RRAM-based convolutional block 100 and the alternative XNOR circuit 730.

The BDPE 700 may include more or fewer components than those illustrated in FIG. 10 and may perform additional functions other than those described herein. The alternative XNOR circuit 730 may be implemented similarly as the RRAM-based convolutional block 100 but having to reload the kernels in the RRAM array 110 for the XNOR operation rather than having the kernel bits pre-stored in the RRAM array 110.

Figure 11:
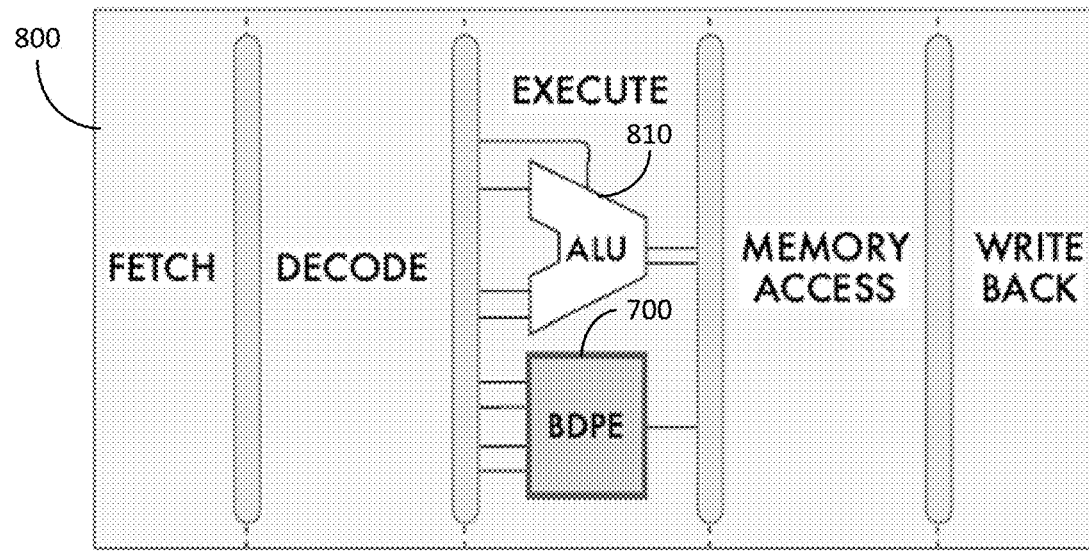
FIG. 11 illustrates a central processing unit including the binary dot product engine of FIG. 10 in accordance with some embodiments.

FIG. 11 is a simplified block diagram of a central processing unit (CPU) 800 including the BDPE 700. In the example illustrated, the BDPE 700 is integrated in the execution stage of the CPU 800 pipeline alongside an arithmetic and logic unit (ALU) 810. The BDPE 700 receives operands from a decode stage, similarly to the ALU 810 and passes the result to the execute/memory access pipeline register.

Figure 12:
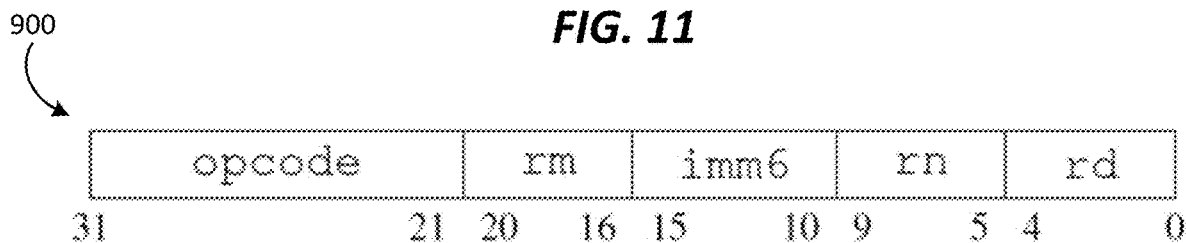
FIG. 12 illustrates an instruction format of instructions provided to the binary dot product engine of claim FIG. 10 in accordance with some embodiments.

In one example, the CPU 800 is an Architecture Reference Manual version 8 (ARMv8) compatible CPU. Accordingly, some of the unused opcodes of the ARMv8 may be assigned to and be used to create instructions for the BDPE 700. FIG. 12 illustrates a format 900 of the new instructions. In one example opcodes 10000011000 and 11000011000 are repurposed to specify custom instructions for the BDPE 700. In the format 900, "rm" and "rn" specify addresses of 64-bit input registers, "imm6" represents a 6-bit immediate, and "rd" specifies the address of the destination 64-bit output register. Each of the new instructions may be decoded in the decode stage of the CPU 800 pipeline such that the content of the register specified by "rm" serves as input data of the BDPE; the content of the register represented by the "rn" is the input kernel; "imm6" specifies the address of the kernel stored in the RRAM array 110; and the second most significant bit (second MSB) of the opcode designates the control bit 750.

Figure 13:
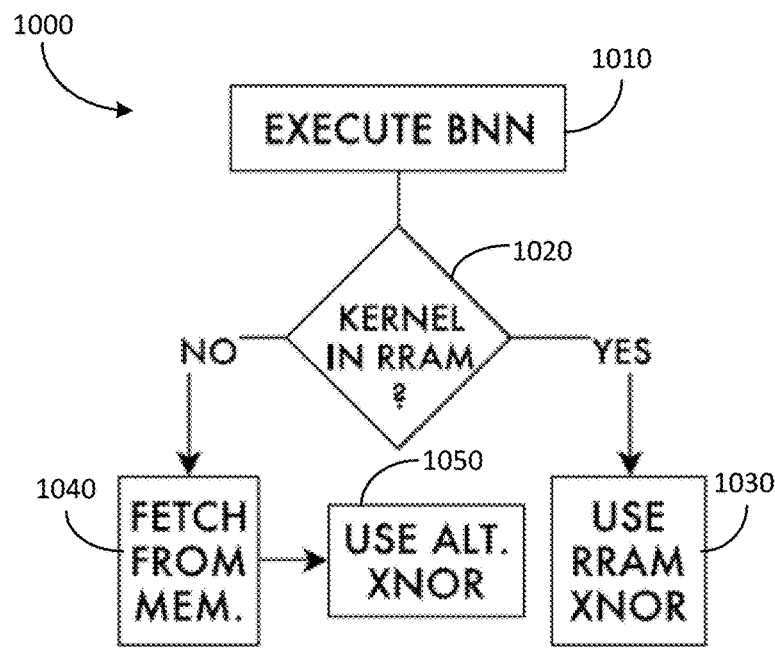
FIG. 13 illustrates a flowchart of a method of executing a binary neural network using the central processing unit of FIG. 11 in accordance with some embodiments.

FIG. 13 is a flowchart of an example method 1000 of performing a binary dot product operation. It should be understood that the order of the steps disclosed in method 1000 could vary. Additional steps may also be added and not all of the steps may be required. In the example illustrated, the method 1000 includes executing, using the CPU 800, a binary neural network (at block 1010). The CPU 800 may be implemented in a machine learning system or image recognition system that uses binary neural network (BNN) for processing edge data. The CPU 800 processes the edge data using the BNN to process the edge data using the BDPE 700. The method 1000 includes determining whether a kernel for execution of the BNN is stored in the RRAM array 110 (at block 1020). During profiling, the binary neural network is used to perform a single inference while the kernel space is profiled to select the most frequently used kernels (for example, a plurality of frequently used kernel matrices). The selected kernels are stored in the RRAM array 110 and a configuration file is generated containing the information about the content of the RRAM array 110. Particularly, the CPU 800 may profile the BNN to determine the most commonly used kernels and store the kernels in the RRAM array 110.

When the kernel for execution of the BNN is stored in the RRAM array 110, the method 1000 includes performing, using the RRAM-based convolutional block 100, the XNOR operation of the BNN (at block 1030). As discussed above, the BDPE fetches the input data from a memory and performs the XNOR operation to output the binary dot product of the input matrix and the kernel matrix. When the kernel for execution of the BNN is not stored in the RRAM array 110, the method 1000 includes fetching the kernel from memory (at block 1040) and performing, using the alternative XNOR circuit 730, the XNOR operation of the BNN (at block 1050).

The CPU 800 provides instructions in the format 900 described above to the BDPE 700. By controlling the opcode, and consequently the control bit, either the output of the RRAM array 110, or the output of the alternative XNOR circuit 730 is used to calculate the final result of the binary dot product operation.

Figure 14A:
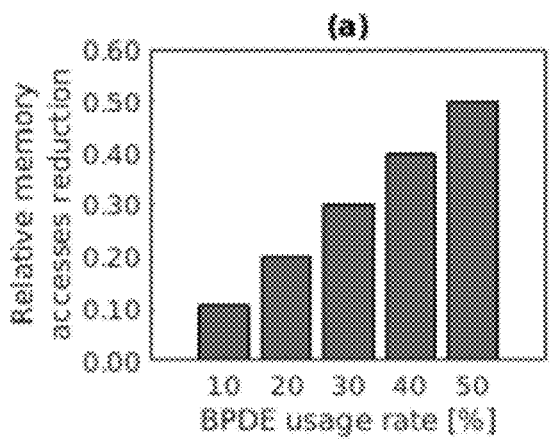
FIG. 14A-15B illustrate bar graphs showing relative benefits of the central processing unit of FIG. 11 over a conventional central processing unit.
Figure 14B:
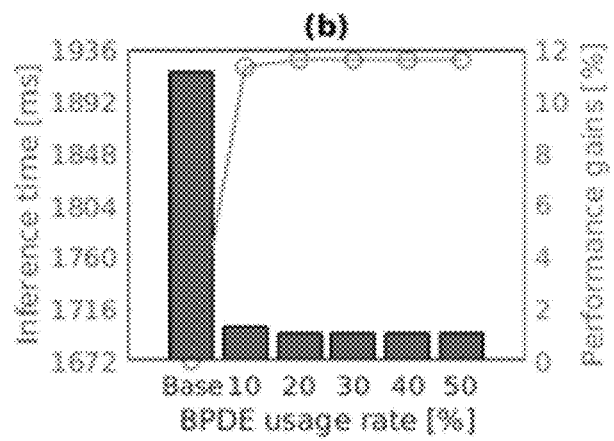
Figure 15A:
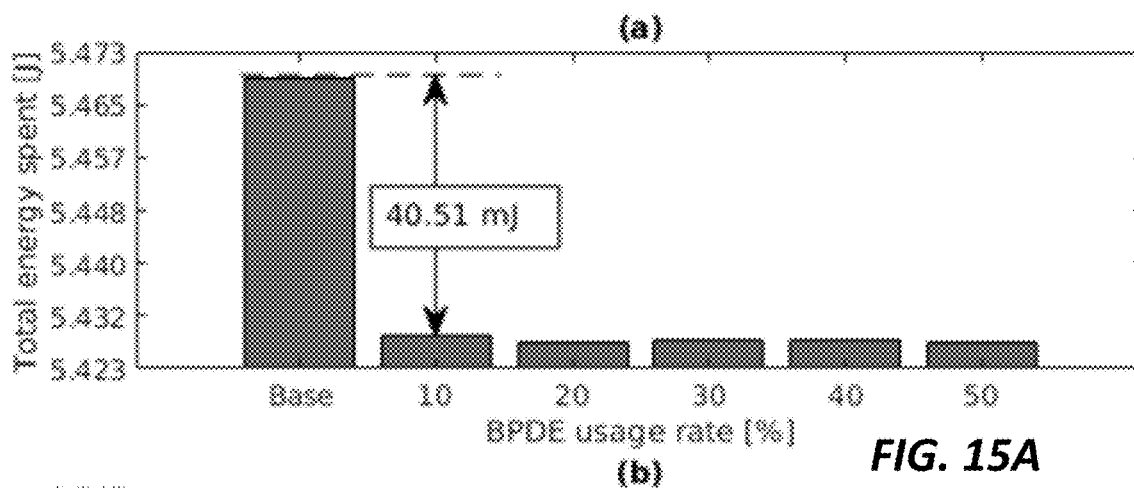
Figure 15B:
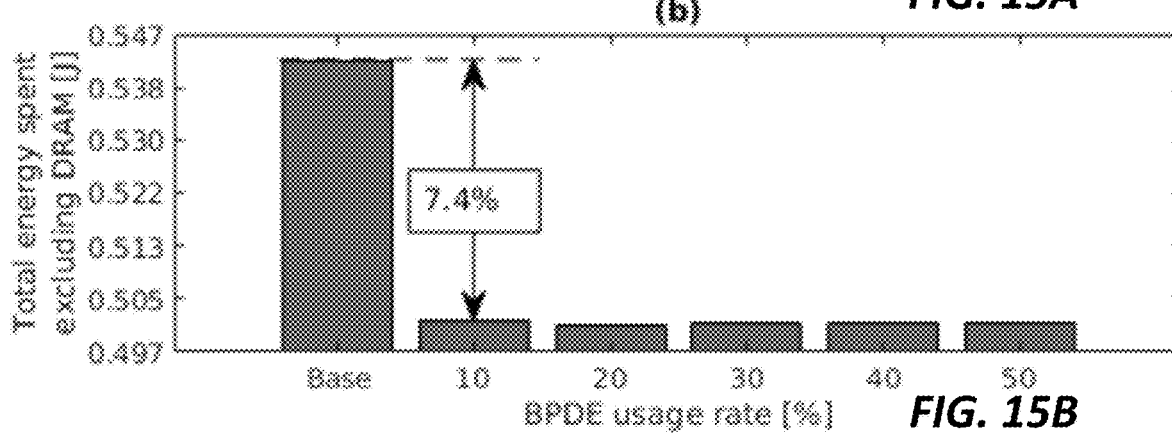

The CPU 800 including the BDPE 700 provides several time and energy benefits over a similar CPU without a BDPE 700. FIG. 14A illustrates the relative memory accesses reduction in the CPU 800 based on variation in RRAM usage rate between 10% and 50%. The RRAM usage rate refers to the percentage of XNOR operations performed based on the frequently used kernels stored in the BDPE. The evaluation is performed for a YoloV3 image recognition system using a CPU 800 including the BDPE 700 and a CPU without the BDPE 700 (referring to "base" in FIGS. 14B-15B). As shown in FIG. 14B, the CPU 800 provides significant time savings and performance gains compared to a base CPU. As shown in FIGS. 15A and 15B, the CPU 800 also provides significant energy saving compared to a base CPU.

What is claimed is:

1. A resistive random-access memory based convolutional block comprising:
   a complementary pair of resistive random access memories (RRAMs) including a first resistive random-access memory (RRAM) and a second RRAM;
   a programming circuit coupled to the complementary pair of RRAMs and configured to
   receive a kernel bit from a kernel matrix,
   program the first RRAM to at least one selected from a group consisting of a low resistive state and a high resistive state based on the kernel bit, and
   program the second RRAM to the other of the low resistive state and the high resistive state;
   a XNOR sense amplifier circuit coupled to the complementary pair of RRAMs and configured to:
   receive an input bit from an input matrix;
   perform a XNOR operation between the input bit and the kernel bit read from the complementary pair of RRAMs; and
   output a XNOR output based on the XNOR operation.

2. The resistive random-access memory based convolutional block of claim 1, further comprising:
   an isolation circuit coupled between the complementary pair of RRAMs and the XNOR sense amplifier circuit, the isolation circuit isolating the XNOR sense amplifier circuit from the complementary pair of RRAMs during a programming phase of the RRAMs.

3. The resistive random-access memory based convolutional block of claim 1, further comprising:
   a second complementary pair of RRAMs, wherein the programming circuit is coupled to the second complementary pair of RRAMs and is further configured to:
   receive a second kernel bit from the kernel matrix, and
   program the second complementary pair of RRAMs based on the second kernel bit; and
   a second XNOR sense amplifier circuit coupled to the second complementary pair of RRAMs and configured to:
   receive a second input bit from the input matrix;
   perform a second XNOR operation between the second input bit and the second kernel bit read from the second complementary pair of RRAMs; and
   output a second XNOR output based on the second XNOR operation.

4. The resistive random-access memory based convolutional block of claim 3, further comprising:
   a combinational bitcount circuit configured to count a number of zeros in the XNOR output and the second XNOR output.

5. A hardware accelerator including the resistive random-access memory based convolutional block of claim 4.

6. A central processing unit, comprising:
   a binary dot product engine (BDPE) including the resistive random-access memory based convolutional block of claim 4,
   wherein the complementary pair of RRAMs, the second complementary pair of RRAMs, the XNOR sense amplifier circuit, and the second XNOR sense amplifier circuit are part of an RRAM XNOR array and wherein the BDPE further comprises:
   an alternative XNOR circuit;
   a kernel local address unit providing the kernel matrix as an input to the RRAM XNOR array and the alternative XNOR circuit;
   an input data unit providing the input matrix to the RRAM XNOR array and the alternative XNOR circuit; and
   a selection circuit configured to select between a first output of the RRAM XNOR array and a second output of the alternative XNOR circuit and provide at least one selected from a group consisting of the first output or the second output to the combinational bitcount circuit.

7. The central processing unit of claim 6, wherein the central processing unit is configured to
   profile a binary neural network,
   determine a plurality of frequently used kernel matrices in the binary neural network, and
   store the plurality of frequently used kernel matrices in the RRAM XNOR array.

8. The central processing unit of claim 7, wherein the central processing unit is further configured to:
   execute the binary neural network;
   determine that a kernel for execution is stored in the RRAM XNOR array;
   perform, using the RRAM XNOR array, a XNOR operation with the kernel of the binary neural network when the kernel is stored in the RRAM XNOR array; and
   control the selection circuit to provide the first output to the combinational bitcount circuit.

9. The central processing unit of claim 7, wherein the central processing unit is further configured to:
   execute the binary neural network;
   determine that a kernel for execution is not stored in the RRAM XNOR array;
   fetch the kernel from a memory;
   perform, using the alternative XNOR circuit, a XNOR operation with the kernel of the binary neural network when the kernel is not stored in the RRAM XNOR array; and
   control the selection circuit to provide the second output to the combinational bitcount circuit.

10. A resistive random-access memory based convolutional block comprising:
    a complementary resistive random access memory (RRAM) array;
    a programming circuit coupled to the complementary RRAM array and configured to:
    receive a plurality of kernel bits from a kernel matrix, and
    program a plurality of columns of the complementary RRAM array based on a corresponding one of the plurality of kernel bits; and
    a XNOR sense amplifier circuit array coupled to the complementary RRAM array and configured to:
    receive a plurality of input bits from an input matrix,
    perform a bit-wise XNOR operation between the plurality of input bits and the plurality of kernel bits stored in the complementary RRAM array, and
    output a plurality of XNOR outputs based on the bit-wise XNOR operation.

11. The resistive random-access memory based convolutional block of claim 10, further comprising:
an isolation circuit array coupled between the complementary RRAM array and the XNOR sense amplifier circuit array, the isolation circuit array isolating the XNOR sense amplifier circuit array from the complementary RRAM array during a programming phase of the complementary RRAM array.

12. The resistive random-access memory based convolutional block of claim 10, further comprising:
a plurality of enabling transistors coupled between each RRAM of the complementary RRAM array and the XNOR sense amplifier circuit array to selectively couple the RRAM to the XNOR sense amplifier circuit array.

13. The resistive random-access memory based convolutional block of claim 10, wherein at least a portion of the programming circuit is provided in a deep N-well.

14. The resistive random-access memory based convolutional block of claim 10, further comprising:
a combinational bitcount circuit configured to count a number of zeros in the plurality of XNOR outputs.

15. A hardware accelerator including the resistive random-access memory based convolutional block of claim 14.

16. A central processing unit, comprising:
a binary dot product engine (BDPE) including the resistive random-access memory based convolutional block of claim 14,
wherein the complementary RRAM array and the XNOR sense amplifier circuit array are part of an RRAM XNOR array and wherein the BDPE further comprises:
an alternative XNOR circuit;
a kernel local address unit providing the kernel matrix as an input to the RRAM XNOR array and the alternative XNOR circuit;
an input data unit providing the input matrix to the RRAM XNOR array and the alternative XNOR circuit; and
a selection circuit configured to select between a first output of the RRAM XNOR array and a second output of the alternative XNOR circuit and provide one of the first output or the second output to the combinational bitcount circuit.

17. The central processing unit of claim 16, wherein the central processing unit is configured to
profile a binary neural network,
determine a plurality of frequently used kernel matrices in the binary neural network, and
store the plurality of frequently used kernel matrices in the RRAM XNOR array.

18. The central processing unit of claim 17, wherein the central processing unit is further configured to:
execute the binary neural network;
determine that a kernel for execution is stored in the RRAM XNOR array;
perform, using the RRAM XNOR array, a XNOR operation with the kernel of the binary neural network when the kernel is stored in the RRAM XNOR array; and
control the selection circuit to provide the first output to the combinational bitcount circuit.

19. The central processing unit of claim 17, wherein the central processing unit is further configured to:
execute the binary neural network;
determine that a kernel for execution is not stored in the RRAM XNOR array;
fetch the kernel from a memory;
perform, using the alternative XNOR circuit, a XNOR operation with the kernel of the binary neural network when the kernel is not stored in the RRAM XNOR array; and
control the selection circuit to provide the second output to the combinational bitcount circuit.

20. The central processing unit of claim 19, wherein the central processing unit is further configured to provide an instruction to the BDPE, wherein the instruction comprises:
an opcode including a control bit provided to the selection circuit to select between the first output and the second output;
addresses of 64-bit input registers;
a 6-bit immediate specifying an address of a kernel stored in the RRAM XNOR array; and
an address of a 64-bit output register.

* * * * *